United States Patent
Zhang et al.

(10) Patent No.: US 8,830,006 B2
(45) Date of Patent: Sep. 9, 2014

(54) OSCILLATOR CIRCUIT FOR GENERATING CLOCK SIGNAL

(75) Inventors: Jinglin Zhang, Suzhou (CN); Yali Wang, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 121 days.

(21) Appl. No.: 13/607,730

(22) Filed: Sep. 9, 2012

(65) Prior Publication Data

US 2013/0265093 A1    Oct. 10, 2013

(30) Foreign Application Priority Data

Apr. 6, 2012 (CN) .......................... 2012 1 0100138

(51) Int. Cl.
    *H03K 3/0231*   (2006.01)
(52) U.S. Cl.
    CPC ................................ *H04K 3/0231* (2013.01)
    USPC ........................................... 331/111; 331/143
(58) Field of Classification Search
    CPC ....... H03K 3/0231; H03K 3/354; H03K 4/08; H03K 4/50; H03K 4/501; H03K 4/502
    USPC ................................................. 331/111, 143
    See application file for complete search history.

(56) References Cited

U.S. PATENT DOCUMENTS

| | | | |
|---|---|---|---|
| 4,642,579 A | 2/1987 | Hobrecht | |
| 5,128,634 A | 7/1992 | Pigott | |
| 5,699,024 A | 12/1997 | Manlove | |
| 5,770,979 A | 6/1998 | Kolanko | |
| 5,870,000 A * | 2/1999 | Matsuda et al. | 331/34 |
| 5,912,593 A | 6/1999 | Susak | |
| 6,020,792 A | 2/2000 | Nolan | |
| 6,078,208 A | 6/2000 | Nolan | |
| 6,147,541 A * | 11/2000 | Seesink | 327/337 |
| 6,853,258 B2 * | 2/2005 | Toliver et al. | 331/34 |
| 7,053,724 B2 | 5/2006 | Rusu | |
| 7,268,635 B2 | 9/2007 | Meltzer | |
| 2012/0026820 A1 | 2/2012 | Pu | |

* cited by examiner

*Primary Examiner* — Ryan Johnson
(74) *Attorney, Agent, or Firm* — Charles Bergere (57) ABSTRACT

An oscillator circuit includes a charge current source and first and second muxes. The first mux has a common node, a discharge node, a control node and a charge node coupled to the charge current source. The control node couples the common node to either the discharge or charge nodes. The second mux has a shared node, a reference node, a control node and a ground node coupled to ground. The second mux control node couples the shared node to either the reference or ground nodes. A capacitor is coupled between the common node and the shared node. A comparator has a non-inverting input coupled to the common node, an inverting input coupled to the reference node, and an output coupled to the first and second control nodes. A discharge current sink couples the discharge node to ground and an oscillator output is provided by the comparator.

16 Claims, 7 Drawing Sheets

FIG. 1

(PRIOR ART)

OSCILLATOR CIRCUIT FOR GENERATING CLOCK SIGNAL

BACKGROUND OF THE INVENTION

The present invention relates to oscillators and in particular to oscillators and methods for generating clock signals.

Oscillator circuits are found in many electronic circuit applications and are often used for generating clock signals that control the timing of circuits or control the logic state of a device. For example, oscillator circuits can be used in conjunction with circuits such as DC/DC converters, audio receivers, counters, shifting modules, microprocessors and FM (frequency modulation) circuitry.

Typically, charging and discharging of one or more capacitors primarily determines the frequency of the clock signal provided by an oscillator circuit. Such charging and discharging is often controlled by constant current sources or current mirrors supplying charge currents to the capacitors and the discharging is effected by controlling transistors coupled across the capacitors. However, prior art oscillators require a relatively large number of circuit components and therefore their power consumption requirements and silicon overhead may be unacceptable.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention.

In the drawings, like numerals are used to indicate like elements throughout. Furthermore, the terms "comprises," "comprising," or variations thereof, are intended to cover a non-exclusive inclusion, such that module, circuit, device components, method steps and structures that comprises a list of elements does not include only those elements but may include other elements not expressly listed or inherent to such module, circuit, steps or device components. An element or step proceeded by "comprises" does not, without more constraints, preclude the existence of additional identical elements or steps that comprises the element or step. Furthermore, in this specification the terms gate, source and drain can be interchanged respectively with the terms base, emitter and collector as can the terms coupled and connected. Similarly, when appropriate, charge (when associated with a capacitor) and voltage may be suitably interchanged.

In one embodiment, the present invention provides an oscillator circuit including a charge current source, at least one voltage reference source and a first multiplexer. The first multiplexer has a common node, a discharge node, at least one first multiplexer control node and a charge node coupled to the charge current source. In operation, the first multiplexer control node controls the first multiplexer to selectively couple the common node to either the discharge node or the charge node. There is also a second multiplexer with a shared node, a reference node coupled to the at least one voltage reference source, at least one second multiplexer control node and a ground node coupled to a ground rail. In operation, the second multiplexer control node controls the second multiplexer to selectively couple the shared node to either the reference node or the ground node.

The oscillator circuit includes a capacitor with a first electrode coupled to the common node and a second electrode coupled to the shared node. A comparator has a first input coupled to the first electrode of the capacitor, a second input coupled to the at least one voltage reference source and a comparator output is coupled to the first control node and the second control node. A discharge current sink couples the discharge node to the ground rail and an oscillator output is coupled to the comparator output.

In another embodiment the present invention provides an oscillator circuit comprising a charge current source, and at least one voltage reference source and a first multiplexer. The first multiplexer has a common node, a discharge node and a charge node coupled to the charge current source. In operation, the common node is selectively coupled to either the discharge node or the charge node. A second multiplexer has a shared node, a reference node coupled to the at least one voltage reference source and a ground node coupled to a ground rail. In operation, the shared node is selectively coupled to either the reference node or the ground node.

The oscillator circuit also includes a capacitor with a first electrode coupled to the common node and a second electrode coupled to the shared node. A comparator has a first input coupled to the first electrode of the capacitor, a second input coupled to the at least one voltage reference source and a comparator output coupled to controlling inputs of the first and second multiplexers. A discharge current sink couples the discharge node to the ground rail and an oscillator output is coupled to the comparator output. In operation, the comparator output provides a signal that controls the first and second multiplexers. As a result, when the voltage on the first electrode of the capacitor is below a reference voltage on the second input of the comparator, the charge node is coupled to the common node and the ground node is coupled to the shared node. Furthermore, when the voltage on the first electrode of the capacitor is above the reference voltage on the second input of the comparator, the discharge node is coupled to the common node and the reference node is coupled to the shared node.

In a further embodiment the present invention, a method for generating a clock signal at an output of an oscillator circuit is provided. The method includes detecting when the voltage on a first electrode of a capacitor has risen to a threshold value. The detecting is at an input of a comparator, wherein the first electrode of the capacitor is connected by a first multiplexer to a charge current source and a second electrode of the capacitor is connected by a second multiplexer to a ground rail.

The method performs switching of the first and second multiplexers when the voltage on the first electrode of the capacitor has reached the threshold value. This results in the first electrode being disconnected from the charge current source and connected to a discharge current sink and the second electrode being disconnected from the ground rail and connected to the voltage reference source. There is also performed a process of detecting when the voltage on a first electrode has dropped to the threshold value. This detecting is at the input of the comparator and is performed whilst the first electrode is connected to the discharge current sink and the second electrode is connected to the voltage reference source. The method also performs switching the first and second multiplexers when the voltage on the first electrode of the capacitor has dropped to the threshold value. This results in the first electrode being disconnected from the discharge current sink and connected to the charge current source and the second electrode being disconnected from the voltage reference source and connected to the ground rail. The method also includes generating the clock signal from an output of the comparator.

Figure 1:
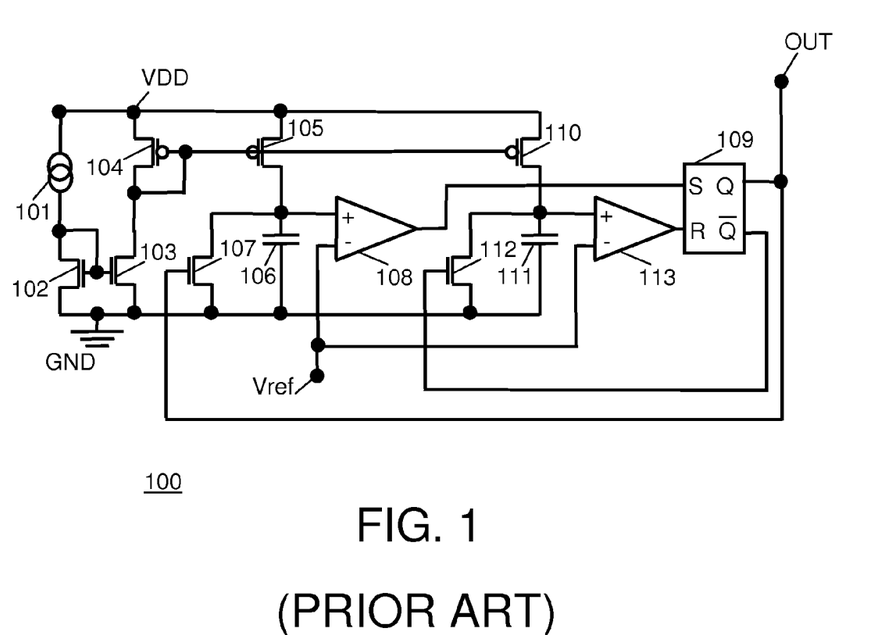
FIG. 1 is a circuit diagram of a prior art oscillator circuit.

Referring to FIG. 1, a circuit diagram of a conventional oscillator 100 is shown. The oscillator 100 includes a constant current source 101 coupled between a supply voltage node VDD on one side and a drain and a gate electrode of a first reference transistor 102 on the other side. The gate electrode of the first reference transistor 102 is coupled to a gate electrode of a first mirror transistor 103 and the source electrodes of both transistors 102, 103 are coupled to a return voltage node (ground GND).

A second reference transistor 104 with a source electrode is coupled to the supply voltage node VDD and a gate electrode of the second reference transistor 104 is coupled to its own drain electrode. The gate electrode of the second reference transistor 104 is also coupled to both a drain electrode of the first mirror transistor 103 and to a gate electrode of a second mirror transistor 105. A source electrode of the second mirror transistor 105 is coupled to the supply voltage node VDD and a drain electrode of the second mirror transistor 105 is coupled to a first electrode of a set capacitor 106. A second electrode of the set capacitor 106 is coupled to ground GND and the first electrode of the set capacitor 106 is also coupled to both a drain electrode of a set discharge transistor 107 and a positive input of a set comparator 108.

The oscillator 100 further includes a Set-Reset latch 109 with a set input S coupled to an output of the set comparator 108. There is also a third mirror transistor 110 that has a source electrode coupled to the supply voltage node VDD, a gate electrode coupled to the gate electrode of the second reference transistor 104, and a drain electrode that is coupled to a first electrode of a reset capacitor 111. A second electrode of the reset capacitor 111 is coupled to ground GND and the first electrode of the reset capacitor 111 is also coupled to both a drain electrode of a reset discharge transistor 112 and a positive input of a reset comparator 113. An output of the reset comparator 113 is coupled to a reset input R of the Set-Reset latch 109 and negative inputs of both comparators 108, 113 are coupled to a common threshold voltage reference node Vref.

An output Qbar of the Set-Reset latch 109 is coupled to a gate electrode of the reset discharge transistor 112 and output Q of the Set-Reset latch 109 is coupled to a gate electrode of the set discharge transistor 107. The set discharge transistor 107 and reset discharge transistor 112 have source electrodes coupled to ground GND and as shown an output node OUT is coupled to the output Q of the Set-Reset latch 109. A clock signal Sf is supplied to the output node OUT and the frequency of this clock signal Sf is dependent on charging rates of the set and reset capacitors 106, 111.

As will be apparent to a person skilled in the art, the oscillator 100 is a typical example of prior art circuits for generating clock signals by controlling charging rates of the capacitors 106, 111. Such circuits require a relatively large number of components and therefore their power consumption requirements and silicon overheads may be unacceptable.

Figure 2:
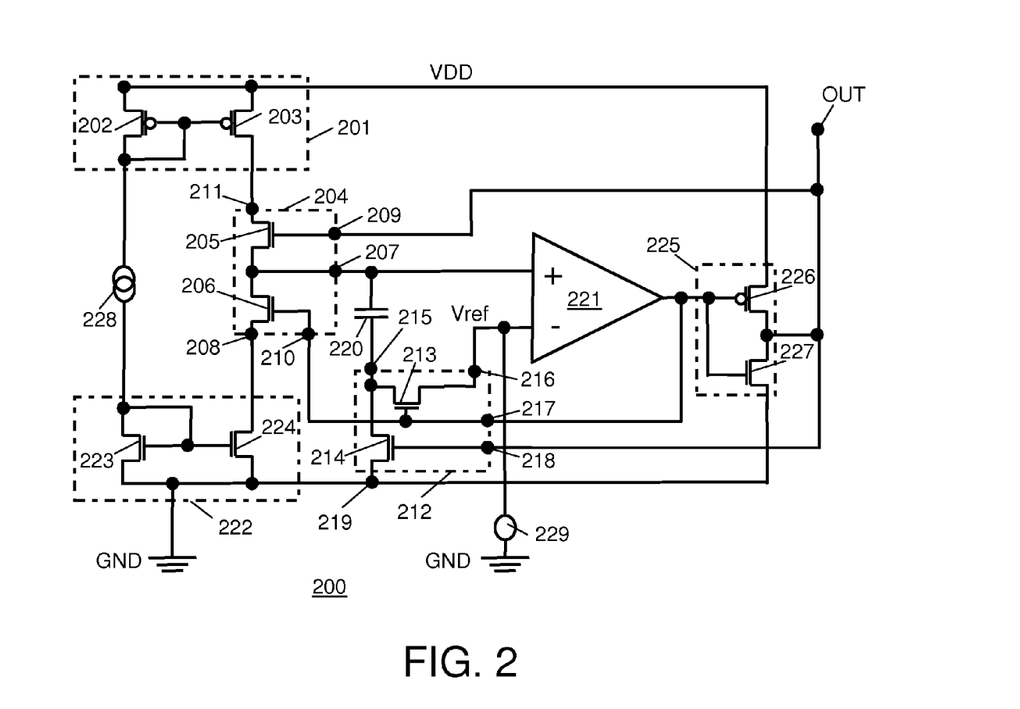
FIG. 2 is a circuit diagram of an oscillator circuit in accordance with a preferred embodiment of the present invention.

FIG. 2 is a circuit diagram of an oscillator circuit 200 in accordance with a preferred embodiment of the present invention. The oscillator circuit 200 includes a charge current source, in the form of a charge current mirror 201, formed from a charge current reference transistor 202 and a charge current mirror transistor 203. Gate electrodes of the transistors 202, 203 are coupled together and are also coupled to a drain electrode of the charge current reference transistor 202, whereas the source electrodes of transistors 202, 203 are coupled to a voltage supply rail VDD.

A first multiplexer 204 with a common node 207, a discharge node 208, complementary first multiplexer control nodes 209, 210 and a charge node 211 coupled to a drain electrode of the charge current mirror transistor 203. In operation, the complementary first multiplexer control nodes 209, 210 control the first multiplexer 204 to selectively couple the common node 207 to either the discharge node 208 or the charge node 211.

A second multiplexer 212 has a shared node 215, a reference node 216, complementary second multiplexer control nodes 217, 218 and a ground node 219 coupled to a ground rail GND. In operation the complementary second multiplexer control nodes 217, 218 control the second multiplexer 212 to selectively couple the shared node 215 to either the reference node 216 or the ground node 219.

A capacitor 220 has a first electrode coupled to the common node 207 and a second electrode coupled to the shared node 215. A comparator 221 has a first input (in this embodiment a non-inverting input) coupled to the first electrode of the capacitor 220. A second input of the comparator 221 (in this embodiment an inverting input) is coupled to the reference node 216 of the second multiplexer 212. The comparator 221 has a comparator output coupled to the complementary first control nodes 209, 210 and also coupled to the complementary second control nodes 217, 218.

The oscillator circuit 200 also includes a discharge current sink, in the form of a discharge current mirror 222, which couples the discharge node 208 to the ground rail GND. The discharge current mirror 222 is formed from a discharge current reference transistor 223 and a discharge current mirror transistor 224. Gate electrodes of the transistors 223, 224 are coupled together and are also coupled to a drain electrode of the discharge current reference transistor 223, whereas the source electrodes of transistors 223, 224 are coupled to the ground rail GND.

In this embodiment, the first multiplexer 204 is formed from series coupled NMOS transistors 205, 206 with a gate of transistor 205 coupled to the control node 209 and a gate of transistor 206 coupled to the control node 210. Similarly, the second multiplexer 212 is formed from series coupled NMOS transistors 213, 214 with a gate of transistor 213 coupled to the control node 217 and a gate of transistor 214 coupled to the control node 218.

The oscillator circuit 200 also has an inverter 225 with an input coupled to the comparator output OUT and an output of the inverter the inverter 225 is coupled to an oscillator output OUT, hence, the inverter 225 couples the oscillator output OUT to the comparator output. The inverter also couples the comparator output to both the complementary first multiplexer control node 209 and the complementary second multiplexer control node 218. In contrast, the comparator output is directly coupled to both the complementary first multiplexer control node 210 and the complementary second multiplexer control node 217. The inverter 225 is formed from complementary series coupled PMOS and NMOS transistors 226, 227 as will be apparent to a person skilled in the art.

A drain electrode of the discharge current mirror transistor 224 is coupled to the discharge node 208. Whereas drain electrodes of the charge current reference transistor 202 and the discharge current reference transistor 223 are coupled via a constant current source 228. In this embodiment there is a single constant voltage reference 229 source coupled to both the reference node 216 and the second (inverting) input of the comparator 221. In operation, the constant voltage reference source 229 provides a constant reference voltage Vref.

Figure 3:
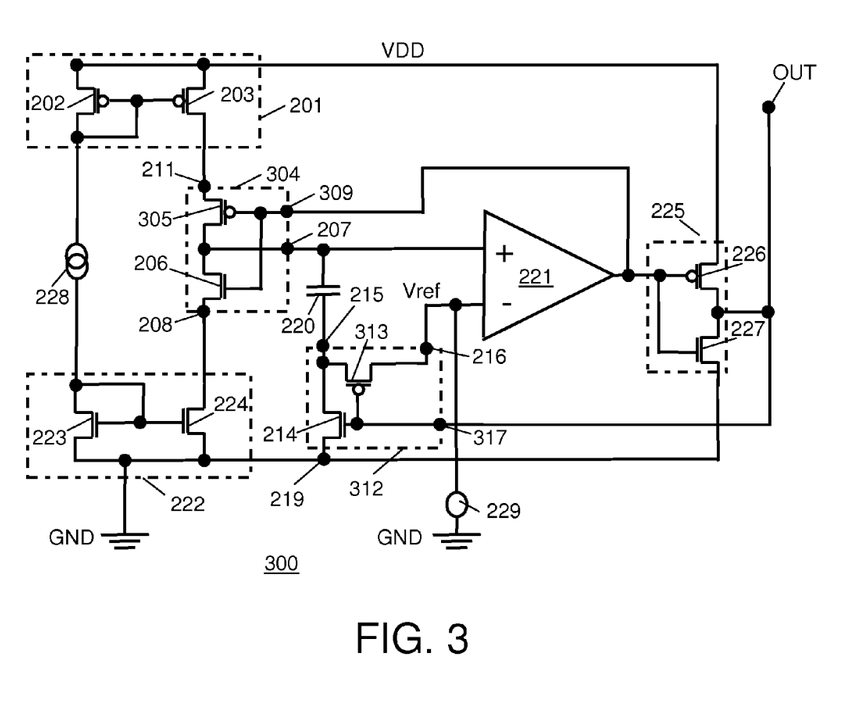
FIG. 3 is a circuit diagram of an oscillator circuit in accordance with another preferred embodiment of the present invention.

Referring to FIG. 3, a circuit diagram of an oscillator circuit 300 in accordance with another preferred embodiment of the present invention is shown. The oscillator circuit 300 is similar to the oscillator circuit 200 and therefore to avoid repetition only the differences will be described. The oscillator circuit 300 has a first multiplexer 304 that replace the first multiplexer 204 and a second multiplexer 312 that replace the second multiplexer 212. The first multiplexer 304 has a single control node 309 directly coupled to the output of the comparator 221. The first multiplexer 304 is formed from complementary pair of transistors these being a PMOS transistor 305 and NMOS transistor 206 with both of their gate electrodes coupled to the single control node 309. Similarly, the second multiplexer 312 has a single control node 317 coupled to the output of the comparator 221 via the inverter 225. The second multiplexer 312 is formed from complementary pair of transistors these being a PMOS transistor 313 and NMOS transistor 214 with both of their gate electrodes coupled to the single control node 317. In this embodiment, the constant voltage reference source 229 provides a reference voltage Vref that has maximum voltage value of half the maximum supply voltage provided between the voltage supply rail VDD and the ground rail GND.

Figure 4:
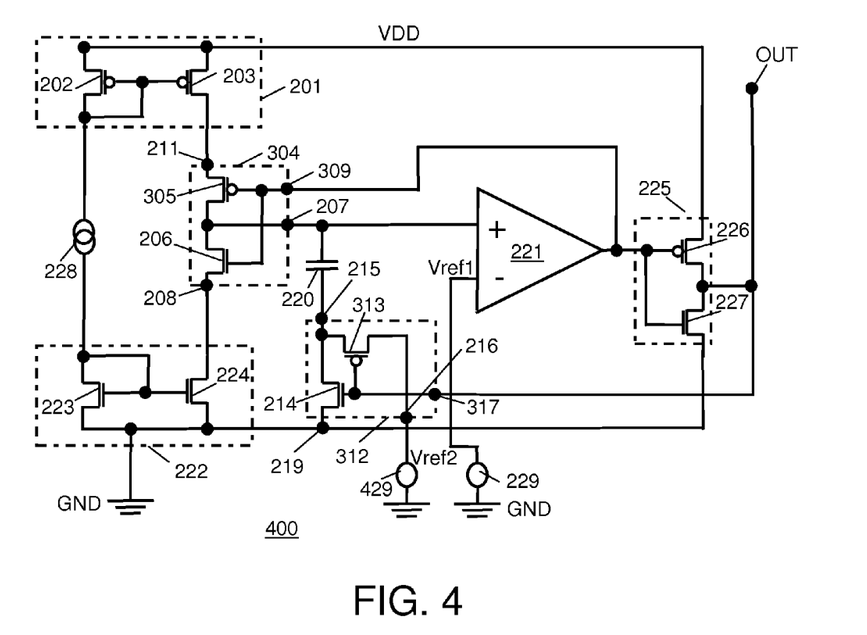
FIG. 4 is a circuit diagram of an oscillator circuit in accordance with a further preferred embodiment of the present invention.

FIG. 4 is a circuit diagram of an oscillator circuit 400 in accordance with a further preferred embodiment of the present invention. The oscillator circuit 400 is similar to the oscillator circuit 300 and therefore to avoid repetition only the differences will be described. The oscillator circuit 400 has a second constant voltage reference source 429 that provides a second voltage reference Vref2, whereas the constant voltage reference source 229 provides a reference voltage Vref1. The constant voltage reference source 229 is coupled to the second input (inverting input) of the comparator 221, but not to the reference node 216, and the second constant voltage reference source 429 is coupled to the reference node 216.

Figure 5:
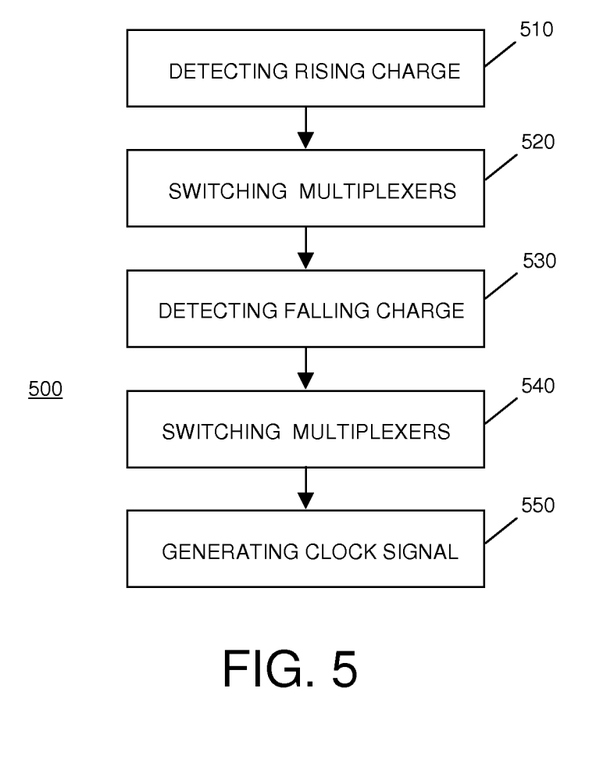
FIG. 5 is a flow chart illustrating a method for generating a clock signal at an output of an oscillator circuit in accordance with a preferred embodiment of the present invention.

FIG. 5 is a flow chart illustrating a method 500 for generating a clock signal Sf at the output OUT of an oscillator circuit in accordance with a preferred embodiment of the present invention. The method 500 can be implemented using the oscillator circuits 200, 300 or 400 and in order to better explain the method 500 it will be described with reference to the oscillator circuit 200. However, it is to be understood that the method 500 is not limited to being performed on the oscillator circuit 200. Accordingly, although an inverting input is referenced in this method 500, it is to be understood that the term inverting input is only used for clarity with reference to processes of detecting performed by the oscillator circuit 200. It will therefore be apparent that when the method 500 is performed on other oscillator embodiments the non-inverting input may possibly be used for processes of detecting.

At a block 510, the method 500 performs a process of detecting when the voltage on a first electrode of the capacitor 220 has risen to a threshold value Vref. The detecting is at a non-inverting input of the comparator 221 and as previously mentioned the first electrode of the capacitor 220 is connected by the first multiplexer 204 to the charge current source (charge current mirror 201). Also, the second electrode of the capacitor 220 is connected, by the second multiplexer 212, to the ground rail GND. The method 500, at a block 520, then performs switching the first and second multiplexers 204,212 when the voltage on the first electrode of the capacitor 220 has reached the threshold value Vref. This switching results in the first electrode of the capacitor 220 being disconnected from the charge current source and connected to the discharge current sink (discharge current mirror 222). In addition, the second electrode of the capacitor 220 is disconnected from the ground rail GND and is connected to the voltage reference source 229.

At a block 530 there is performed a process of detecting when the voltage on a first electrode of the capacitor 220 has dropped to the threshold value Vref. This detecting is performed at the non-inverting input of the comparator 221, whilst the first electrode of the capacitor 220 is connected to the discharge current sink and the second electrode of the capacitor 220 is connected to the voltage reference source 229. There is then performed, at a block 540, a process of switching the first and second multiplexers 204, 212. This process of switching, at block 540, occurs when the voltage on the first electrode of the capacitor 220 has dropped to the threshold value Vref so that the first electrode is disconnected from the discharge current sink and connected to the charge current source. This process of switching also provides for the second electrode of the capacitor 220 to be disconnected from the voltage reference source 229 and connected to the ground rail GND. At a block 550 the method 500 performs generating the clock signal Sf from an output of the comparator 221.

From the above, it will be apparent that when the preferred embodiments of the oscillator circuit 200, 300, 400 are in operation, the common node is selectively coupled to either the discharge node or the charge node. Also, it will be apparent that the shared node is selectively coupled to either the reference node or the ground node.

Figure 6:
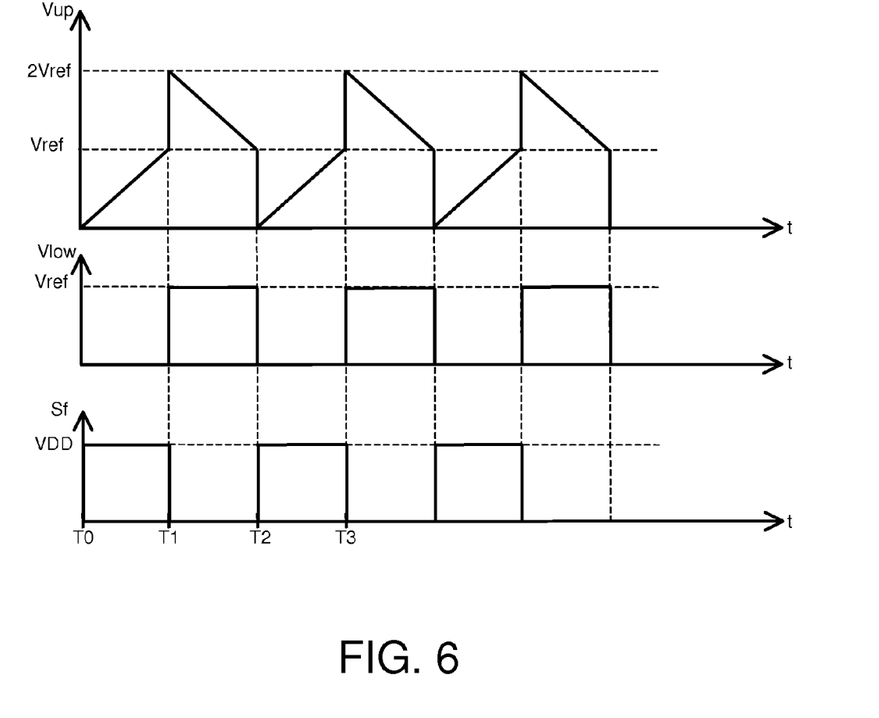
FIG. 6 is a timing diagram illustrating signals generated by the oscillator circuit of FIG. 2 or 3 in accordance with a preferred embodiment of the present invention.

Referring to FIG. 6, a timing diagram illustrating signals generated by the oscillator circuit 200, 300 in accordance with a preferred embodiment of the present invention is shown. It will be apparent that the oscillator circuits 200,300 when in operation are configured so that the common node 207 is selectively coupled to either the discharge node 208 or the charge node 211. Also, when in operation the shared node 215 is selectively coupled to either the reference node 216 or the ground node 219. As illustrated, between time T0 and T1 the first electrode (VUP) of the capacitor 220 is charged from 0 volts to Vref. This is because the capacitor 220 is coupled between the charge current mirror 221 and the ground rail GND by virtue of the common node 207 being selectively coupled to the charge node 211 and the shared node 215 being selectively coupled to the ground node 219.

At time T1 the voltage at the first electrode (VUP) has reached the reference voltage Vref and thus the output of the comparator 221 switches from zero to the supply rail voltage (VDD) thereby switching the multiplexers 204, 212. This results in the capacitor 220 being selectively coupled between the discharge current mirror 222 and voltage reference source 229. This occurs because the common node 207 is selectively coupled to the discharge node 208 and the shared node 215 is selectively coupled to the reference node 216. The voltage at the first electrode (VUP) at time T1 is 2 Vref and this charge discharges between time T1 and T2.

At time T2 the voltage at the first electrode (VUP) reaches the threshold or reference voltage Vref applied to the inverting input of the comparator 221. The output of the comparator 221 therefore drops from VDD to zero volts and as a result the multiplexers 204, 212 switch. This results in the capacitor 220 being coupled again between the charge current mirror 201 and the ground rail GND. The voltage at the first electrode (VUP) of the capacitor 220 therefore drops to zero volts and then begins charging from 0 volts to Vref during time T2 to T3.

As shown, the voltage on the second electrode (Vlow) of the capacitor 220 is at zero volts between time periods T0 to T1 and T2 to T3, whereas the output voltage, that generates the clock signal Sf, is equal to the supply rail voltage (VDD). During the time period between T1 and T2 the voltage on the second electrode (Vlow) is equal to Vref and the output voltage Vout is equal to zero volts (GND).

Figure 7:
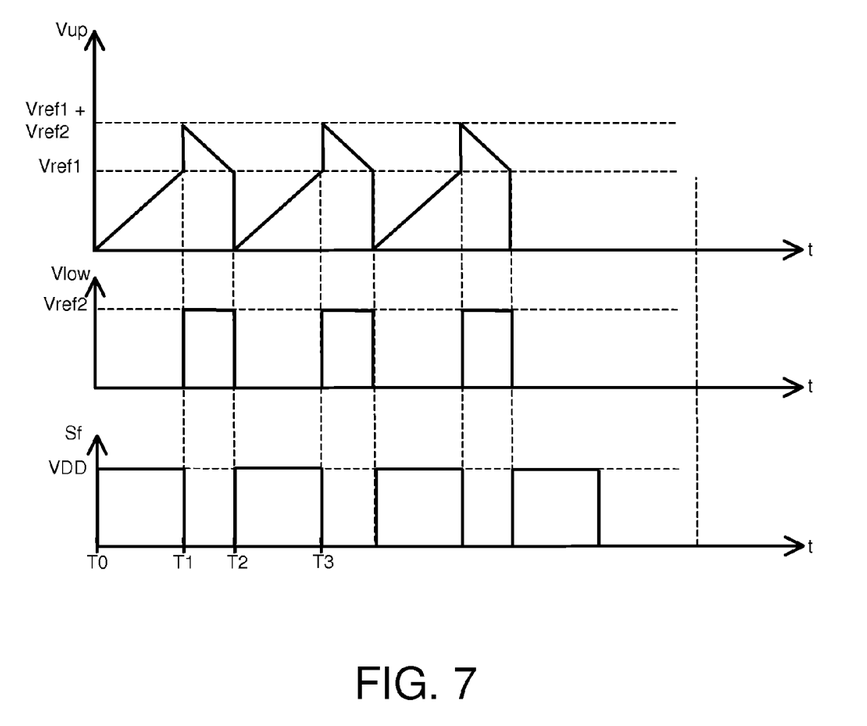
FIG. 7 is a timing diagram illustrating signals generated by the oscillator circuit of FIG. 4 in accordance with another preferred embodiment of the present invention.

FIG. 7 shows a waveform or timing diagram illustrating signals generated by the oscillator circuit 400 in accordance with another preferred embodiment of the present invention. It will be apparent that the oscillator circuit 400 when in operation is configured so that the common node 207 is selectively coupled to either the discharge node 208 or the charge node 211. Also, when in operation the shared node 215 is selectively coupled to either the reference node 216 or the ground node 219. As illustrated, between time T0 and T1 the first electrode (VUP) of the capacitor 220 is charged from 0 volts to Vref1. This is because the capacitor 220 is coupled between the charge current mirror 221 and the ground rail GND by virtue of the common node 207 being selectively coupled to the charge node 211 and the shared node 215 being selectively coupled to the ground node 219.

At time T1 the voltage at the first electrode (VUP) has reached the reference voltage Vref1 and thus the output of the comparator 221 switches from zero to the supply rail voltage (VDD) thereby switching the multiplexers 304, 312. This results in the capacitor 220 being selectively coupled between the discharge current mirror 222 and the second constant voltage reference source 429 that supplies the second reference voltage reference Vref2. This occurs because the common node 207 is selectively coupled to the discharge node 208 and the shared node 215 is selectively coupled to the reference node 216. The voltage at the first electrode (VUP) at time T1 is Vref1+Vref2 and this charge discharges between time T1 and T2.

At time T2 the voltage at the first electrode (VUP) reaches the threshold or reference voltage Vref1 applied to the inverting input of the comparator 221. The output of the comparator 221 therefore drops from VDD to zero volts and as a result the multiplexers 304, 312 switch. The capacitor 220 is therefore coupled again between the charge current mirror 201 and the ground rail GND. The voltage at the first electrode (VUP) of the capacitor 220 therefore drops to zero volts and then begins charging from 0 volts to Vref1 during time T2 to T3.

As shown, the voltage on the second electrode (Vlow) of the capacitor 220, is at zero volts between time periods T0 to T1 and T2 to T3, whereas the output voltage of the comparator, that generates the clock signal Sf, is equal to the supply rail voltage (VDD). During the time period between T1 and T2 the voltage on the second electrode (Vlow) is equal to Vref2 and the output voltage Vout is equal to zero volts (GND). It will be clear to a person skilled in the art that, by altering the values of Vref1 and Vref2, the duty cycle and frequency of the clock signal Sf can be varied to meet specific application requirements.

To summarize the above with reference to the oscillator circuit 200, in operation, the comparator output provides a signal that controls the first and second multiplexers 204,212. When a voltage on the first electrode (Vup) of the capacitor 220 is below the reference voltage Vref on the inverting input of the comparator 221, the charge node 211 is coupled to the common node 207 and the ground node 219 is coupled to the shared node 215. Alternatively, when the voltage on the first electrode Vup of the capacitor 220 is above the reference voltage Vref on the inverting input of the comparator 221, the discharge node 208 is coupled to the common node 207 and the reference node 216 is coupled to the shared node 215.

Advantageously, the present invention provides an oscillator circuit and method that provides a clock signal without the need for a relatively large number of circuit components. This therefore allows for clock signals to be generated without the need for relatively large power consumption or unacceptably large silicon overhead.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. For instance, the inverting and non-inverting inputs of the comparator could be interchanged along with complementary amendments to the multiplexers and thus perform the invention as claimed. It is understood, therefore, that this invention is not limited to the particular embodiment disclosed, but covers modifications within the spirit and scope of the present invention as defined by the appended claims.

The invention claimed is:

1. An oscillator circuit, comprising:
  a charge current source and a first voltage reference source;
  a first multiplexer with a common node, a discharge node, at least one first multiplexer control node and a charge node coupled to the charge current source, wherein in operation the first multiplexer control node controls the first multiplexer to selectively couple the common node to either the discharge node or the charge node;
  a second multiplexer with a shared node, a reference node, at least one second multiplexer control node and a ground node coupled to a ground rail, wherein in operation the second multiplexer control node controls the second multiplexer to selectively couple the shared node to either the reference node or the ground node;
  a capacitor with a first electrode coupled to the common node and a second electrode coupled to the shared node;
  a comparator with a first input coupled to the first electrode of the capacitor, a second input coupled to the first voltage reference source and a comparator output coupled to the first control node and the second control node;
  a second voltage reference source coupled to the reference node of the second multiplexer, wherein the first and second voltage reference sources provide different voltage values;

a discharge current sink coupling the discharge node to the ground rail; and an oscillator output coupled to the comparator output.

2. The oscillator circuit of claim 1, wherein the charge current source includes a charge current mirror.

3. The oscillator circuit of claim 2, wherein the discharge current sink includes a sink current mirror.

4. The oscillator circuit of claim 3, wherein the current mirror includes a charge current reference transistor and a charge current mirror transistor, and the sink current mirror includes a discharge current reference transistor and a discharge current mirror transistor, and wherein the charge current mirror transistor is coupled to the charge node and the discharge current mirror transistor is coupled to the discharge node.

5. The oscillator circuit of claim 4, wherein the charge current reference transistor has a source electrode coupled to a voltage supply rail and the discharge current reference transistor has a source electrode coupled to the ground rail.

6. The oscillator circuit of claim 5, wherein drain electrodes of the charge current reference transistor and the discharge current reference transistor are coupled via a constant current source.

7. The oscillator circuit of claim 1, further including an inverter with an input coupled to the comparator output, wherein the inverter couples the oscillator output to the first multiplexer control node.

8. An oscillator circuit, comprising:
a charge current source and a first voltage reference source;
a first multiplexer with a common node, a discharge node and a charge node coupled to the charge current source, wherein in operation the common node is selectively coupled to either the discharge node or the charge node;
a second multiplexer with a shared node, a reference node and a ground node coupled to a ground rail, wherein in operation the shared node is selectively coupled to either the reference node or the ground node;
a capacitor with a first electrode coupled to the common node and a second electrode coupled to the shared node;
a comparator with a first input coupled to the first electrode of the capacitor, a second input coupled to the first voltage reference source and a comparator output coupled to controlling inputs of the first and second multiplexers;
a second voltage reference source coupled to the reference node of the second multiplexer, wherein the first and second voltage reference sources provide different voltage values;
a discharge current sink coupling the discharge node to the ground rail; and
an oscillator output coupled to the comparator output,
wherein, in operation, the comparator output provides a signal that controls the first and second multiplexers such that when a charge on the first electrode of the capacitor is below a reference voltage on the second input of the comparator, the charge node is coupled to the common node and the ground node is coupled to the shared node,
and wherein when the charge on the first electrode of the capacitor is above the reference voltage on the second input of the comparator, the discharge node is coupled to the common node and the reference node is coupled to the shared node.

9. The oscillator circuit of claim 8, wherein the charge current source includes a charge current mirror.

10. The oscillator circuit of claim 9, wherein the discharge current sink includes a sink current mirror.

11. The oscillator circuit of claim 10, wherein the current mirror includes a charge current reference transistor and a charge current mirror transistor, and the sink current mirror includes a discharge current reference transistor and a discharge current mirror transistor, wherein the charge current mirror transistor is coupled to the charge node and the discharge current mirror transistor is coupled to the discharge node.

12. The oscillator circuit of claim 11, wherein the charge current reference transistor has a source electrode coupled to a voltage supply rail and the discharge current reference transistor has a source electrode coupled to the ground rail, and wherein drain electrodes of the charge current reference transistor and the discharge current reference transistor are coupled via a constant current source.

13. A method for generating a clock signal at an output of an oscillator circuit, the method including:
detecting when a voltage on a first electrode of a capacitor has risen to a threshold value, the detecting being at an input of a comparator, wherein the first electrode of the capacitor is connected by a first multiplexer to a charge current source and a second electrode of the capacitor is connected by a second multiplexer to ground, wherein the threshold value is provided to the comparator by a first voltage reference source;
switching the first and second multiplexers when the charge on the first electrode of the capacitor has reached the threshold value so that the first electrode is disconnected from the charge current source and connected to a discharge current sink, and wherein the second electrode is disconnected from the ground and connected to a second voltage reference source coupled to the reference node of the second multiplexer, wherein the second voltage reference source provides a reference voltage value which is different from the threshold value;
detecting when the voltage on the first electrode has dropped to the threshold value, the detecting being at the input of the comparator while the first electrode is connected to the discharge current sink and the second electrode is connected to the voltage reference source;
switching the first and second multiplexers when the charge on the first electrode of the capacitor has dropped to the threshold value so that the first electrode is disconnected from the discharge current sink and connected to the charge current source, and wherein the second electrode is disconnected from the second voltage reference source and connected to the ground; and
generating the clock signal from an output of the comparator.

14. The method for generating a clock signal of claim 13, wherein the detecting when the voltage on a first electrode has dropped to the threshold value is characterized by the voltage on a first electrode dropping from a voltage level of a sum of the threshold value and the reference voltage value to the threshold value.

15. The method for generating a clock signal of claim 14, wherein when the oscillator circuit is coupled to a supply voltage, the sum of the threshold value and the reference voltage value has a maximum voltage value of the supply voltage.

16. The method for generating a clock signal of claim 15, wherein the threshold value is provided by a constant voltage source.

* * * * *